(12) United States Patent
Ryding et al.

(10) Patent No.: US 8,124,946 B2
(45) Date of Patent: Feb. 28, 2012

(54) POST-DECEL MAGNETIC ENERGY FILTER FOR ION IMPLANTATION SYSTEMS

(75) Inventors: Geoffrey Ryding, Manchester, MA (US); Theodore Smick, Essex, MA (US); Marvin Farley, Ipswich, MA (US); Takao Sakase, Rowley, MA (US); Bo Vanderberg, Gloucester, MA (US)

(73) Assignee: Axcelis Technologies Inc., Beverly, MA (US)

( * ) Notice: Subject to any disclaimer, the term of this patent is extended or adjusted under 35 U.S.C. 154(b) by 274 days.

(21) Appl. No.: 12/477,631

(22) Filed: Jun. 3, 2009

(65) Prior Publication Data
US 2009/0321630 A1    Dec. 31, 2009

Related U.S. Application Data

(60) Provisional application No. 61/075,657, filed on Jun. 25, 2008.

(51) Int. Cl.
*H01J 37/317*    (2006.01)
*H01J 49/30*    (2006.01)
*H01J 49/42*    (2006.01)

(52) U.S. Cl. ........... 250/492.21; 250/492.23; 250/492.2; 250/281; 250/282; 250/290

(58) Field of Classification Search ............. 250/492.21, 250/492.2, 492.23, 290, 281, 282
See application file for complete search history.

(56) References Cited

U.S. PATENT DOCUMENTS

| | | | |
|---|---|---|---|
| 5,554,857 A | | 9/1996 | Benveniste |
| 5,736,743 A | * | 4/1998 | Benveniste ............. 250/492.21 |
| 6,639,227 B1 | * | 10/2003 | Glavish et al. ............. 250/492.2 |
| 7,304,319 B2 | * | 12/2007 | Kawaguchi et al. ...... 250/492.21 |
| 7,351,987 B2 | * | 4/2008 | Kabasawa et al. ........ 250/492.21 |
| 7,800,083 B2 | * | 9/2010 | Vanderberg et al. ...... 250/492.21 |

* cited by examiner

*Primary Examiner* — Nikita Wells
(74) *Attorney, Agent, or Firm* — Eschweiler & Associates, LLC

(57) ABSTRACT

A system and method for magnetically filtering an ion beam during an ion implantation into a workpiece is provided, wherein ions are emitted from an ion source and accelerated the ions away from the ion source to form an ion beam. The ion beam is mass analyzed by a mass analyzer, wherein ions are selected. The ion beam is then decelerated via a decelerator once the ion beam is mass-analyzed, and the ion beam is further magnetically filtered the ion beam downstream of the deceleration. The magnetic filtering is provided by a quadrapole magnetic energy filter, wherein a magnetic field is formed for intercepting the ions in the ion beam exiting the decelerator to selectively filter undesirable ions and fast neutrals.

14 Claims, 7 Drawing Sheets

POST-DECEL MAGNETIC ENERGY FILTER FOR ION IMPLANTATION SYSTEMS

REFERENCE TO RELATED APPLICATION

This application claims priority to and the benefit of U.S. Provisional Application Ser. No. 61/075,657 which was filed Jun. 25, 2008, entitled, POST-DECEL MAGNETIC ENERGY FILTER FOR ION IMPLANTATION SYSTEMS, the entirety of which is hereby incorporated by reference as if fully set forth herein.

FIELD OF THE INVENTION

The present invention relates generally to ion implantation systems, and more specifically to systems and methods filtering a low-energy ion beam downstream of a decelerator in an ion implantation system.

BACKGROUND OF THE INVENTION

In the manufacture of semiconductor devices and other products, ion implantation systems are used to impart impurities, known as dopant elements, into semiconductor wafers, display panels, or other workpieces. Conventional ion implantation systems or ion implanters treat a workpiece with an ion beam in order to produce n- or p-type doped regions, or to form passivation layers in the workpiece. When used for doping semiconductors, the ion implantation system injects a selected ion species to produce the desired extrinsic material. For example, implanting ions generated from source materials such as antimony, arsenic, or phosphorus results in n-type extrinsic material wafers. Alternatively, implanting ions generated from materials such as boron, gallium, or indium creates p-type extrinsic material portions in a semiconductor wafer.

Conventional ion implantation systems include an ion source that ionizes a desired dopant element which is then accelerated to form an ion beam of prescribed energy. The ion beam is directed at a surface of the workpiece to implant the workpiece with the dopant element. The energetic ions of the ion beam penetrate the surface of the workpiece so that they are embedded into the crystalline lattice of the workpiece material to form a region of desired conductivity. The implantation process is typically performed in a high vacuum process chamber which prevents dispersion of the ion beam by collisions with residual gas molecules and which minimizes the risk of contamination of the workpiece by airborne particulates.

Ion dose and energy are two variables commonly used to define an ion implantation. The ion dose is associated with the concentration of implanted ions for a given semiconductor material. Typically, high current implanters (generally greater than 10 milliamps (mA) ion beam current) are used for high dose implants, while medium current implanters (generally capable up to about 1 mA beam current) are used for lower dose applications. Ion energy is used to control junction depth in semiconductor devices. The energy of the ions which make up the ion beam determine the degree of depth of the implanted ions. High energy processes, such as those used to form retrograde wells in semiconductor devices, typically require implants of up to a few million electron volts (MeV), while shallow junctions may only demand energies below 1 thousand electron volts (keV).

The continuing trend to smaller and smaller semiconductor devices requires implanters with ion sources that serve to deliver high beam currents at low energies. The high beam current provides the necessary dosage levels, while the low energy levels permit shallow implants. Source/drain junctions in complementary metal-oxide-semiconductor (CMOS) devices, for example, require such a high current, low energy application. Thus, the beamline is kept short to provide high current, with a decelerator just upstream of the workpiece to decelerate the ions prior to implantation. The beamline is kept short in order to reduce beam blow-up associated with the low energy beam. However, contamination is often attributed the ion source, and the close proximity of the workpiece to the ion source in such low energy systems leads to the increased potential of contamination finding its way to the workpiece.

Accordingly, it is an object of the present invention to provide a system and method to sufficiently reduce particle contamination in a low energy beamline assembly, wherein efficient contaminant mitigation can be facilitated.

SUMMARY OF THE INVENTION

The present invention overcomes the limitations of the prior art by providing a method and system for reducing particle contamination in an ion implantation system, and in particular, in a low-energy ion implantation system. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an system and method for reducing particle contamination in an ion implantation system using a magnetic energy filter downstream of a decelerator in the ion implantation system for implanting ions into a workpiece at low energies. According to one aspect, the ion implantation system comprises an end station, wherein the workpiece generally resides. An ion source is provided for emitting ions, and a mass analyzer is further provided and configured to mass analyze the ions and define an ion beam at substantially high energies. A decelerator is further provided downstream of the mass analyzer to decelerate the ion beam. Furthermore, a quadrapole magnetic energy filter apparatus is positioned downstream of the decelerator and upstream of the workpiece, wherein the quadrapole magnetic energy filter is configured to further filter neutral ions from the ion beam.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
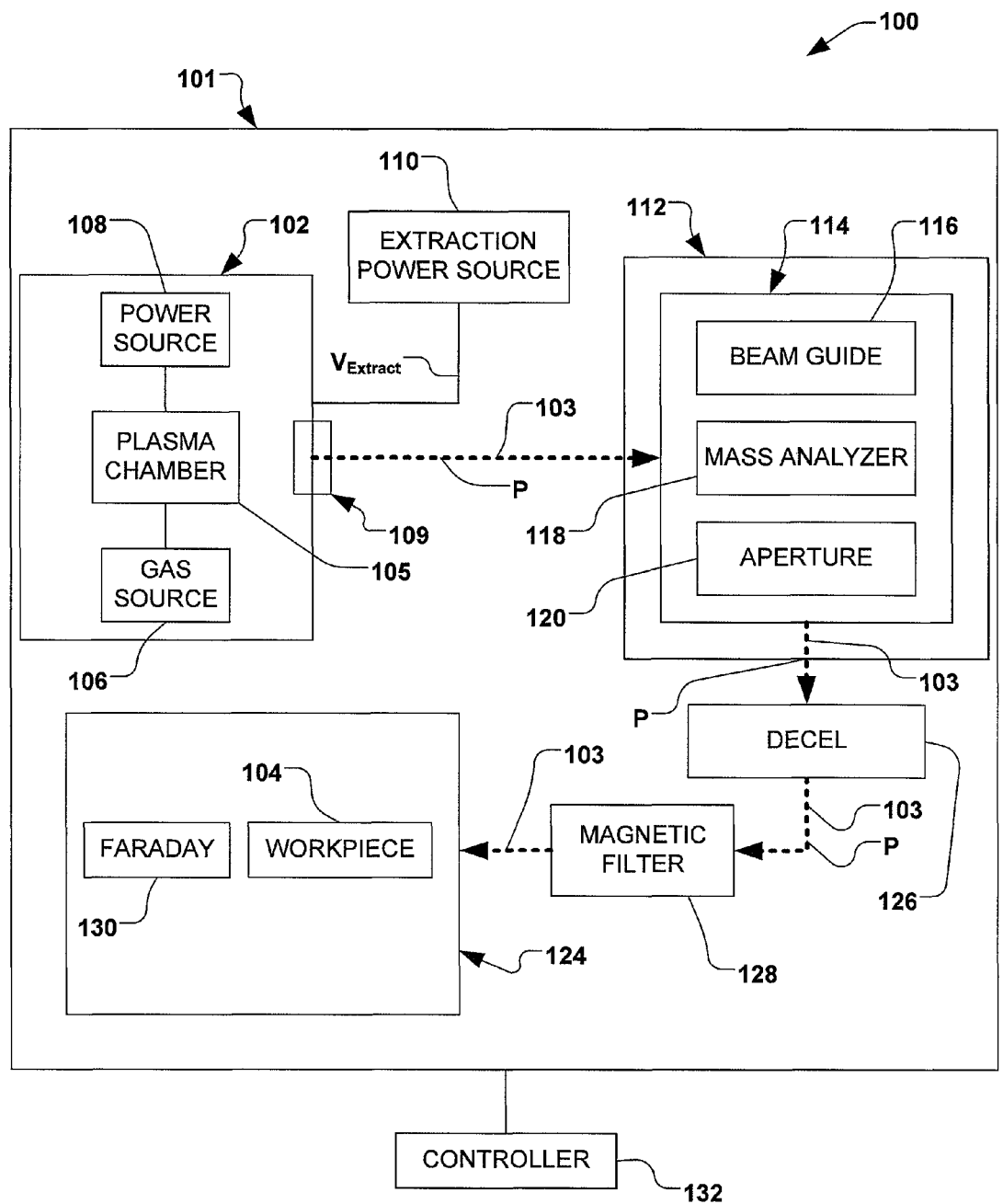
FIG. 1 is a system-level block diagram of an exemplary ion implantation system according to one aspect of the present invention.

The present invention is directed generally towards a method and apparatus for reducing particle contamination during an implantation of ions into one or more workpieces. More particularly, the system and method provide a magnetic filtering of a low-energy ion beam downstream of an accelerator/decelerator of the ion implantation system. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

In order to gain a better understanding of the invention, FIG. 1 illustrates an exemplary ion implantation system 100 depicted in block diagram form, wherein the exemplary ion implantation system is suitable for implementing one or more aspects of the present invention. The system 100 comprises an ion implantation apparatus 101 comprising an ion source 102 for producing a quantity of ions operable to travel along an ion beam path P, thus defining an ion beam 103 for implantation of the ions into a workpiece 104 (e.g., a semiconductor workpiece, display panel, etc.). The ion source 102, for example, generally comprises a plasma chamber 105, a process gas source 106, and a power source 108, wherein positively charged ions are generated from the process gas within the plasma chamber by an application of power from the power source. The process gas source 106 may comprise a source material such as an ionizable gas or vaporized solid source material or species that has been previously vaporized. For an n-type implantation into the workpiece 104, for example, the source materials may comprise boron, gallium or indium. For a p-type implantation, for example, the source materials may comprise arsenic, phosphorus, or antimony.

The ion source 102 further comprises an extraction assembly 109 associated therewith, wherein charged ions are extracted from the ion source upon an application of an extraction voltage $V_{Extract}$ thereto. An extraction power source 110 is operable to provide the extraction voltage $V_{Extract}$, wherein the extraction voltage may be further modulated. A beamline assembly 112 is further provided downstream of the ion source 102, wherein the beamline assembly generally receives the charged ions. The beamline assembly 112, for example, comprises one or more components 114, such as a beamguide 116, a mass analyzer 118, and an aperture 120, wherein the one or more components are operable to form and shape the ion beam 103.

The mass analyzer 118, for example, further comprises a field generating component, such as a magnet (not shown), wherein the mass analyzer generally provides a magnetic field across the ion beam 103, thus deflecting ions from the ion beam at varying trajectories according to a charge-to-mass ratio of the ions. For example, ions traveling through the magnetic field experience a force that directs individual ions of a desired charge to mass ratio along the beam path P and deflects ions of undesired charge to mass ratios away from the beam path. Once through the mass analyzer 118, the ion beam 103 is directed though the aperture 120, wherein the ion beam is generally limited to produce a concise beam for implantation into the workpiece 104.

The ion implantation system 100 further comprises an end station 124, wherein the workpiece 104 generally resides. In the manufacture of integrated circuit devices, display panels, and other products, it is generally desirable to uniformly implant dopant species across the entire surface of the workpiece 104. The ion implantation apparatus 101, for example, is configured to implant ions into a single workpiece 104 (e.g., a "serial" ion implanter), wherein the workpiece generally resides on a pedestal or chuck (not shown) situated within the end station 124. It should be noted that any ion implantation apparatus operable to extract ions from an ion source and implant them into one or more workpieces is contemplated as falling within the scope of the present invention.

The ion implantation apparatus 101, in a further example, comprises a decelerator 126 (also called an accelerator/decelerator lens or "decel" lens) downstream of the mass analyzer 118, wherein up to the decelerator, the ion beam 103 is at a significantly high energy, and wherein the decelerator generally lowers the energy of the ion beam for lower-energy ion implantations.

In accordance with the present invention, the ion implantation apparatus 101 further comprises a magnetic energy filter 128 positioned along the path P of the ion beam 103 at a position downstream of the decelerator 126.

The ion implantation apparatus 101, in one example, further comprises a deep faraday 130 generally situated along the path P of the ion beam 103 at a position downstream of the workpiece 104. In one example, the deep faraday 126 generally resides within the end station and comprises a substantially hollow member. The deep faraday 130, for example, is operable to generally confine the ion beam 103 therein, therein generally minimizing particle contamination within the end station 124. For example, deep faraday 130 is configured to generally entrap or confine the ion beam 103 when no workpiece 104 is present along the path P of the ion beam 103 The deep faraday 130 may serve one or more purposes, such as to substantially confine the ion beam 103 and/or to provide a measurement component for analyzing the ion beam. The deep faraday 130 may alternatively be a standard faraday or beam dump.

The ion implantation system 100 further comprises a controller 132, wherein the controller is operable to control the ion implantation apparatus 101. For example, the controller 132 is operable to control the power source 108 for producing the ions, as well as the extraction power source 110, wherein the ion beam path P is generally controlled. The controller 132 is further operable to adjust the strength and orientation of the magnetic field associated with the mass analyzer 118, among other things. In another example, feedback from the deep faraday 130 is fed to the controller 132 to further control the ion implantation apparatus 101. The controller 132 is further configured to control the decelerator 126 and magnetic energy filter 128, as well as a workpiece scanning system (not shown). It will be appreciated that the controller 132 may comprise a processor, computer system, and/or operator for overall control of the system 100 (e.g., a computer system in conjunction with input by an operator).

Figure 2:
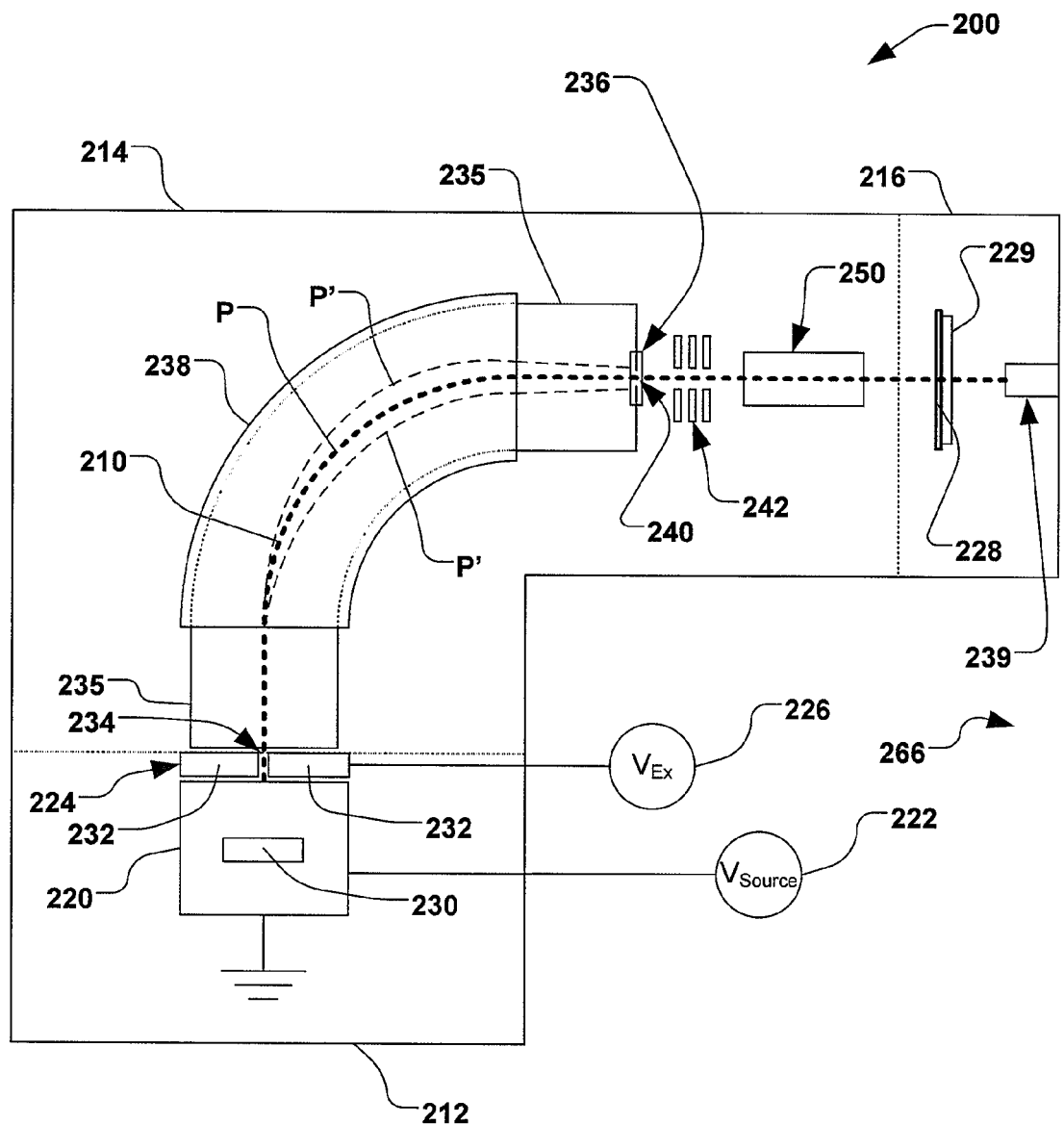
FIG. 2 is a plan view of an exemplary ion implantation apparatus according to another aspect of the present invention.

Referring now to FIG. 2, an exemplary ion implantation apparatus 200 is illustrated, such as the apparatus 101 in FIG. 1, wherein the exemplary ion implantation apparatus is shown in greater detail. It should be again noted that although the ion implantation apparatus 200 is illustrated as one example, the present invention can be practiced using various other types of ion implantation apparatus and systems, such as high energy systems, low energy systems, or other implantation systems, and all such systems are contemplated as falling within the scope of the present invention.

The ion implantation system 200, for example, comprises a terminal 212, a beamline assembly 214, and an end station 216, wherein the terminal comprises an ion source 220 powered by a source power supply 222. The terminal 212 further comprises an extraction assembly 224 powered by an extraction power supply 226 to extract ions from the ion source 220 and thereby to provide the extracted ion beam 210 to the beamline assembly 214. The extraction assembly 224, in conjunction with the beamline assembly 214, for example, are operable to direct the ions toward a workpiece 228 residing on an end effector 229 in the end station 216 for implantation thereof at a given energy level.

In one example, the ion source 220 comprises a plasma chamber (not shown) wherein ions of a process gas or species are energized at a high positive potential $V_{source}$. It should be noted that generally, positive ions are generated, although the present invention is also applicable to systems wherein negative ions are generated by the source 220. The extraction assembly 224 further comprises a plasma electrode 230 and one or more extraction electrodes 232, wherein the plasma electrode is biased with respect to the one or more extraction electrodes, but floats with respect to the plasma within the ion source 220 (e.g., the plasma electrode at 120 kV with respect to the workpiece 228, wherein the workpiece is typically grounded). The one or more extraction electrodes 232, for example, are biased at a voltage less than that of the plasma electrode 230 (e.g., an extraction voltage $V_{Extract}$ of 0-100 kV). The negative relative potential at the one or more extraction electrodes 232 with respect to the plasma creates an electrostatic field operable to extract and accelerate the positive ions out of the ion source 220. For example, the one or more extraction electrodes 232 have one or more extraction apertures 234 associated therewith, wherein positively charged ions exit the ion source 220 through the one or more extraction apertures to form the ion beam 210, and wherein a velocity of the extracted ions is generally determined by the potential $V_{Extract}$ provided to the one or more extraction electrodes.

The beamline assembly 214, according to one aspect of the invention, comprises a beamguide 235 having an entrance near the ion source 220 (e.g., associated with the extraction aperture 234) and an exit with a resolving plate 236, as well as a mass analyzer 238 that receives the extracted ion beam 210 and creates a dipole magnetic field to pass only ions of appropriate charge-to-mass ratio or range thereof (e.g., a mass analyzed ion beam having ions of a desired mass range) to the workpiece 228 positioned in the end station 216. The ionization of source materials in the ion source 220 generates a species of positively charged ions having a desired atomic mass. However, in addition to the desired species of ions, the ionization process will also generate a proportion of ions having other atomic masses as well. Ions having an atomic mass above or below the proper atomic mass are not suitable for implantation and are referred to as undesirable species. The magnetic field generated by the mass analyzer 238 generally causes the ions in the ion beam 210 to move in a curved trajectory, and accordingly, the magnetic field is established such that only ions having an atomic mass equal to the atomic mass of the desired ion species traverse the beam path P to the end station 216.

According to another exemplary aspect of the invention, the ion implantation apparatus 200 comprises deep faraday 239 coupled thereto, wherein the deep faraday is positioned along the path P of the ion beam 210 generally downstream of the workpiece 228, and is operable to intersect the path of the ion beam when the workpiece does not intersect the path. Accordingly, the deep faraday 239 is configured to measure characteristics of the ion beam and/or substantially confine the ion beam 210 within the end station 216 downstream of the workpiece. For example, the deep faraday 239 that can be operatively coupled the controller 128 of FIG. 1, wherein the controller is operable to determine whether characteristics of the ion beam are satisfactory for ion implantation. The deep faraday 239 of FIG. 2, for example, comprises a generally hollow cylinder lined with graphite, wherein the cylinder is substantially deep such that the ion beam is generally entrapped within the deep faraday, thus substantially decreasing particle contamination seen in conventional systems having shallow faradays. The deep faraday 239 may alternatively comprise a standard faraday or beam dump.

In accordance with still another aspect of the invention, the resolving plate 236 at the exit of the beamguide 235 of FIG. 2 operates in conjunction with the mass analyzer 238 to eliminate undesirable ion species from the ion beam 210 which have an atomic mass close to, but not identical, to the atomic mass of the desired species of ions. The resolving plate 236, for example, is further comprised of vitreous graphite or another material such as tungsten or tantalum, and includes one or more elongated apertures 240, wherein the ions in the ion beam 210 pass through the aperture as they exit the beamguide 235. At the resolving plate 236, a dispersion of ions from the path P of the ion beam 210 (e.g., illustrated at P') is at its minimum value, wherein a width of the ion beam (P'-P') is at a minimum where the ion beam 210 passes through the resolving aperture 240.

Downstream of the resolving aperture 240 is a decelerator 242, wherein the decelerator electrostatically accelerates or decelerates the ion beam 210 as it passes therethrough. The decelerator 242, for example, generally permits ion beam to travel at high current and high energy (5 kV-10 kV) through the upstream components, thus mitigating blow up of the ion beam 210 upstream of the decelerator, wherein the decelerator decreases the energy of the ion beam upstream of the workpiece 228 for lower-energy ion implantations. Conventionally, the workpiece 228 would be presented immediately downstream of a decelerator in order to mitigate beam blow-up post-decel. The penalty, however, is a reduction in optical quality of the ion beam. Since the ion beam 210 has a lower energy post-decel, tendency for the ion beam to blow up or lose cohesion is greater due to space charges, wherein the beam is inclined to neutrally expand. This typically requires that the distance of the workpiece from the decel lens be maintained as short as possible to prevent growth in cross sectional area of the beam. Further, energy contamination from fast neutrals and other unwanted off-energy charged ions can still be present post-decel.

The present invention provides a quadrapole magnetic energy filter 250 downstream of the decelerator 242 in order to provide control of beam size and angle post-decel, while also further filtering unwanted ions and fast neutrals from the ion beam 210 prior to implantation into the workpiece 228. The quadrapole magnetic energy filter 250, in one example, comprises an accelerator/decelerator lens is optically matched to a quadrapole triplet lens that is integrated inside a dipole filter magnet. The dipole filter magnet, for example, selects the ion beam of the correct energy and charge state, while the lenses provide control of beam size and angle throughout their transit through the filter and into the workpiece 228.

According to one example, the quadrapole magnetic energy filter 250 can take the form of a mass-analysis magnet, such as the mass analysis magnet described in co-owned U.S. Pat. No. 5,554,857, the contents of which are incorporated by reference herein in its entirety.

Figure 3:
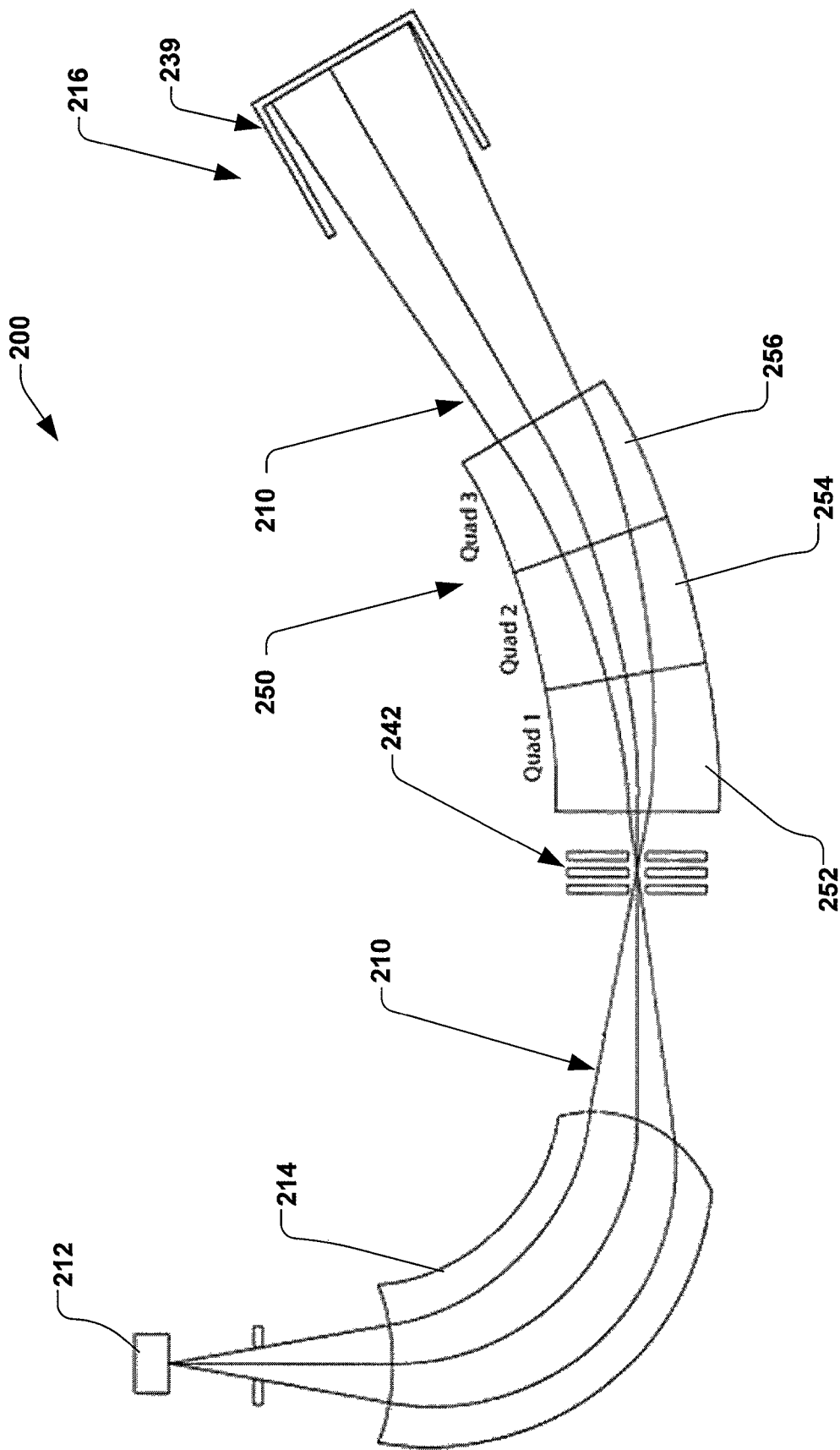
FIG. 3 is an X-Z plan view of an exemplary ion implantation apparatus according to another aspect of the present invention.
Figure 4:
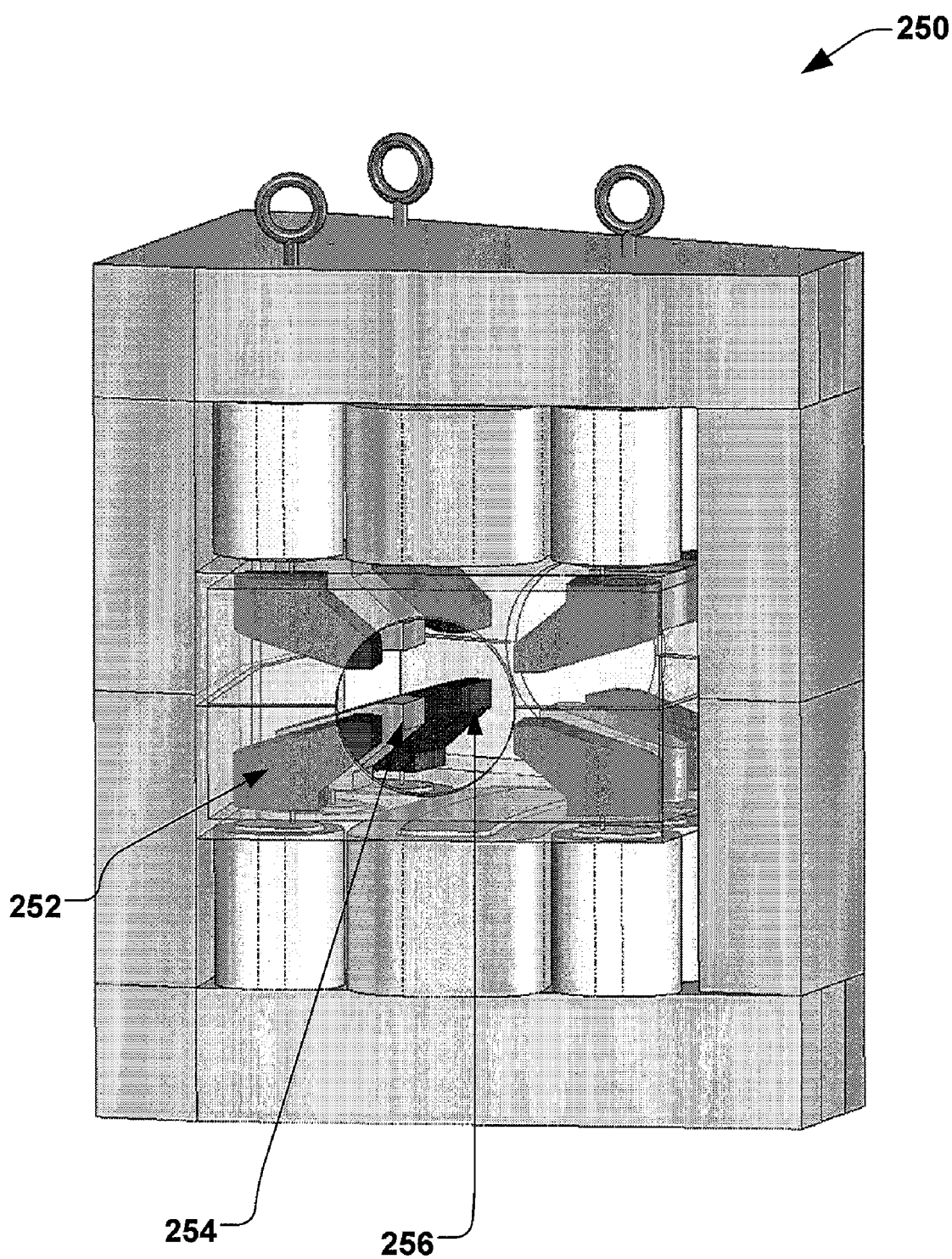
FIG. 4 is perspective plan view of an exemplary quadrapole magnetic energy filter according to still another aspect of the present invention.

The quadrapole magnetic energy filter 250, in another example, is illustrated in FIG. 3, wherein the quadrapole magnetic energy filter provides a final bend of the ion beam, either in the dispersive plane or orthogonal to the dispersive plane. The quadrapole magnetic energy filter 250 (e.g., a dipole magnet with multiple quadrapoles) generally acts as a deflecting magnet with superimposed quadrapole fields that generally focus the ion beam 210 in addition to deflecting the ion beam (e.g., +/−12-15 degrees) to mitigate fast neutrals. For example, the decelerator 242 and quadrapole magnetic energy filter 250 are focally matched for optimal performance. Further, the quadrapole magnetic energy filter 250 advantageously adds to the length of the path P of the ion beam that was previously not possible to conventional beam blow-up, thus moving the workpiece 228 further from the ion source 212. In the present example, three quadrapoles 252, 254, and 256 are provided (also called a quadrapole triplet), as further illustrated in FIG. 4. In one example, a variable resolving slit (not shown) for each quadrapole is provided to provide additional beam control.

Figure 5:
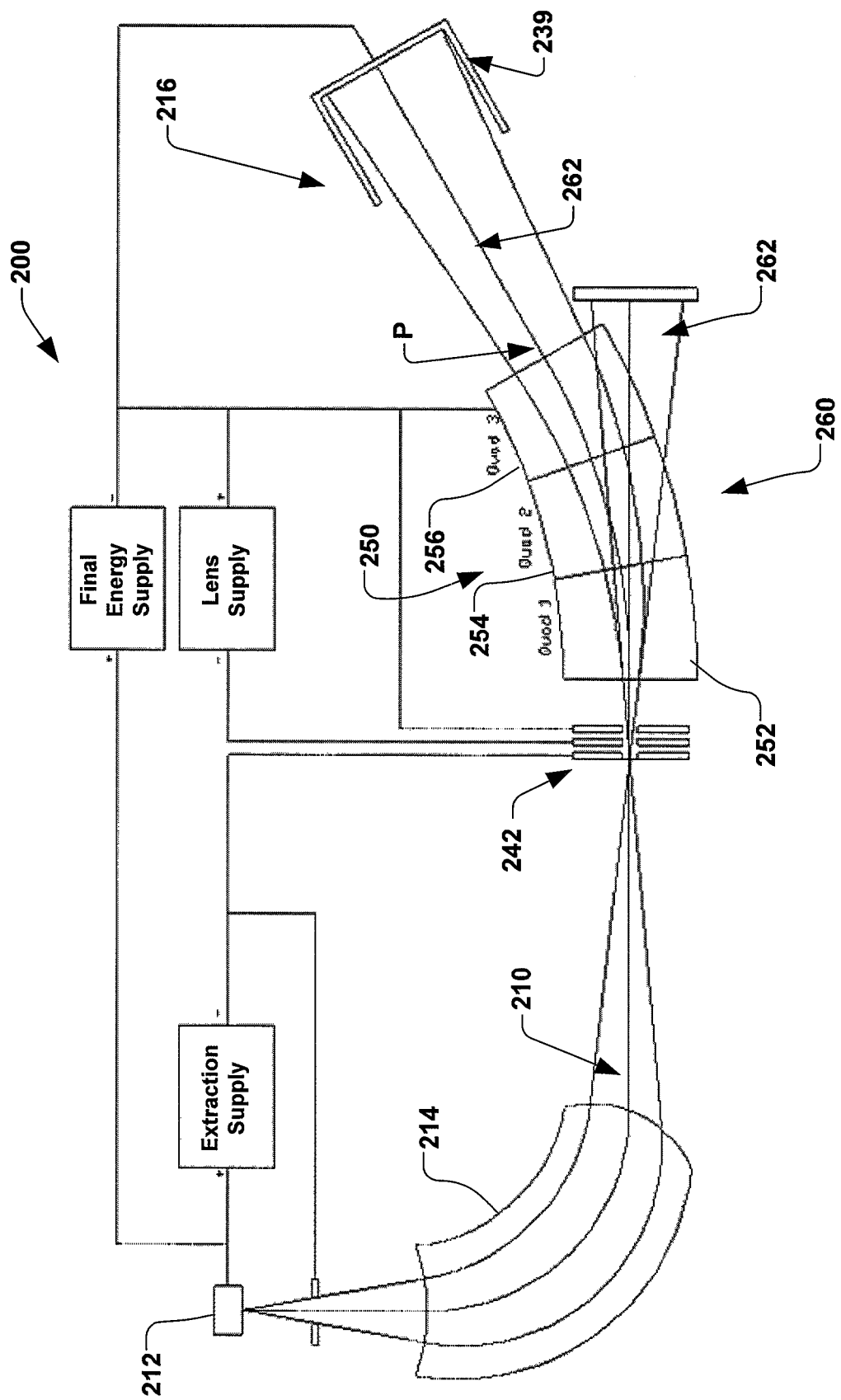
FIG. 5 is another X-Z plan view of an exemplary ion implantation apparatus according to yet another aspect of the present invention.

FIG. 5 illustrates another example of a multipole energy filter 250 (X-Z plan view), wherein three magnetic quadrupole lenses 252, 254, and 256 with a dipole field are superimposed over quadrupole fields, and are matched optically to the electrostatic accel/decel lens 242. The accel/decel lens 242, for example, may be either double-focusing in both X and Y directions, or single focusing in the X direction. The magnetic quadrupole lenses 252, 254, and 256 are alternately focusing and defocusing, and when combined with the accel/decel lens 242, form a series of four stigmatic lenses 260 producing periodic focusing/defocusing and having a net double focusing action on the ion beam 210.

Figure 6:
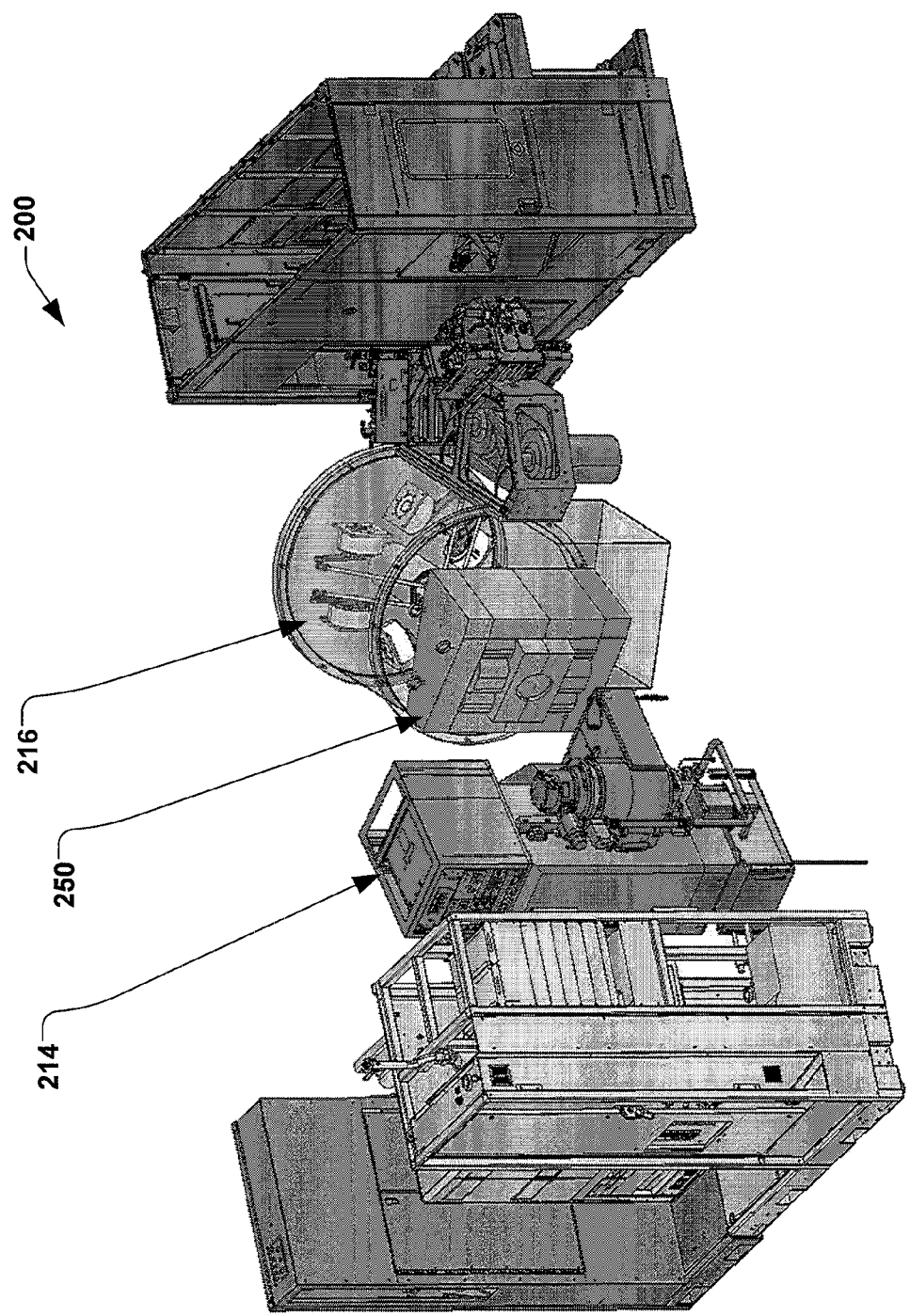
FIG. 6 is perspective plan view of an exemplary ion implantation apparatus according to still another aspect of the present invention.
Figure 7:
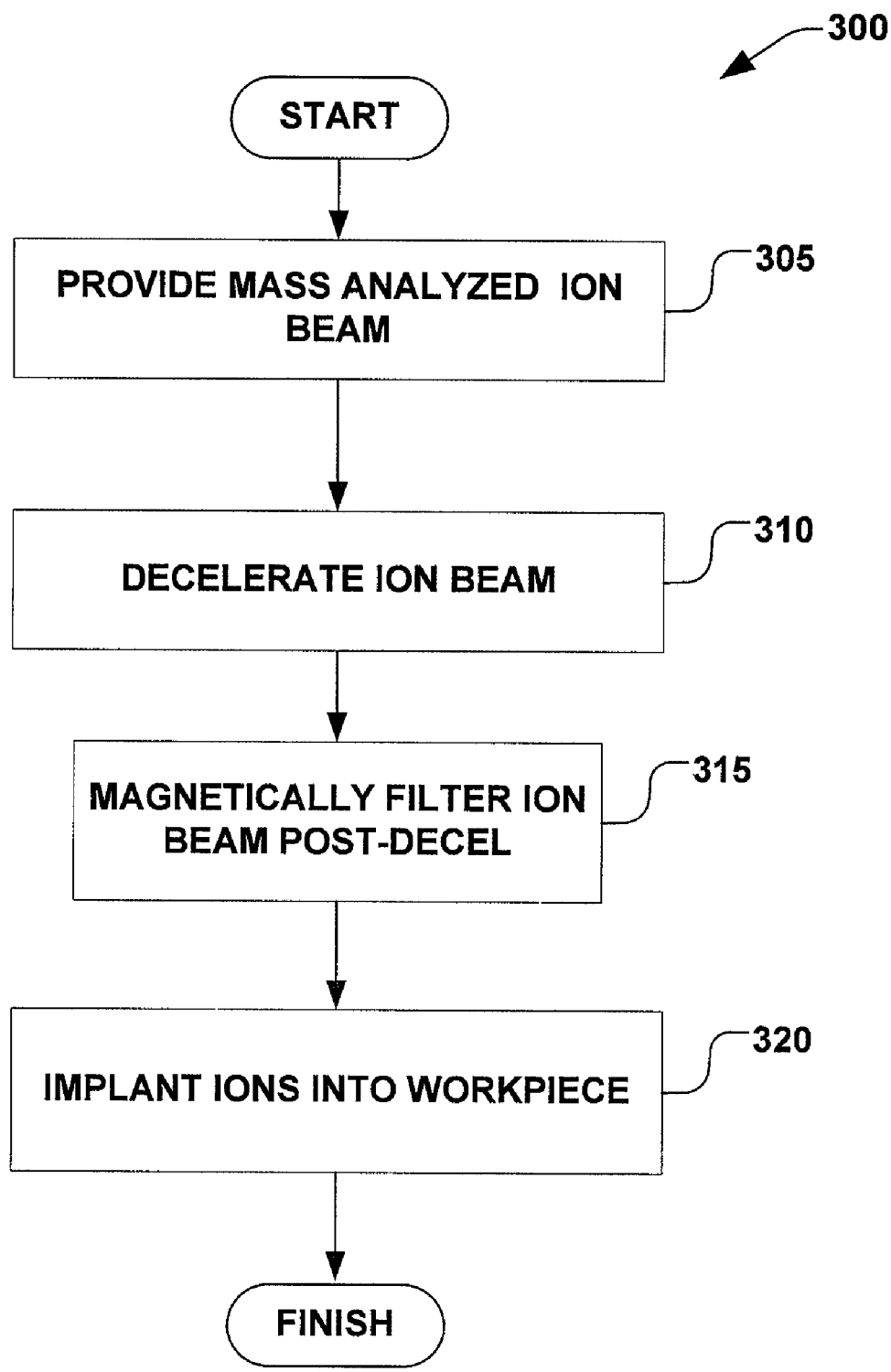
FIG. 7 is a block diagram of an exemplary method for reducing contamination during an implantation of ions into one or more workpieces according to another exemplary aspect of the invention.

By matching the accel/decel lens 242 to a series of quadrupole lenses 252, 254, and 256 the optical quality of the ion beam 210 is effectively restored. The dipole element in the quadrapole magnetic energy filter 250 is utilized to separate the desired low energy beam 262 emerging from the accel/decel lens 242 from the undesirable neutral beam 264. Two plasma electron sources (not shown), for example, may be inserted between lenses 252 and 254 and lenses 254 and 256 to provide additional space charge compensation to enhance low energy transport. Furthermore, an array of magnets producing alternating polarity magnetic cusps above and below the ion beam path P provide for a reflection of electrons to further reduce space charge potentials caused by the low energy ion beams. FIG. 6 further illustrates another view of the exemplary inventive ion implantation system 100 comprising the quadrapole magnetic energy filter 250.

It is appreciated that electrostatic energy filtering tends to extinguish what is termed a "plasma sheath" around the ion beam 210, where the plasma sheath is generally caused by the residual gas around the ion beam 210, therefore not providing the capability of maintaining space charge, wherein fewer free electrons are present to maintain the coherence of the ion beam. The magnetic fields or electrons associated with the quadrapole magnetic filter apparatus 250 of the present invention, however, move along in the magnetic field lines, and thus do not extinguish the plasma. Therefore, the quadrapole magnetic energy filter 250 of the present invention will tend to provide better space charge neutralization.

Thus, in accordance with another aspect of the present invention, FIG. 5 illustrates a method 300 for reducing particle contamination in an ion implantation system. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 5, the method 300 begins with providing a mass-analyzed ion beam in act 305, wherein the ion beam is formed, for example, by an ion implantation system, such as the ion implantation system 100 or 200 of FIGS. 1-3 and 5. In act 310, the ion beam is decelerated after being mass analyzed, wherein an energy of the ion beam is generally reduced. In act 315, the decelerated ion beam is magnetically filtered to generally remove unwanted ions and neutrals, such as via a quadrapole magnetic energy filter apparatus positioned downstream of the decelerator and prior to the workpiece. In act 320, the workpiece is implanted with ions from the decelerated and filtered ion beam, wherein contamination is minimized.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system for implanting ions into a workpiece, the ion implantation system comprising:

an end station, wherein the workpiece generally resides in the end station;

an ion source for emitting ions;

a mass analyzer configured to mass analyze the ions and define an ion beam;

a decelerator downstream of the mass analyzer to decelerate the ion beam; and a quadrapole magnetic energy filter apparatus positioned downstream of the decelerator prior to the workpiece, wherein the quadrapole magnetic energy filter filters neutral ions from the ion beam.

2. The ion implantation system of claim 1, wherein the quadrapole magnetic energy filter apparatus comprises:
a magnet positioned along the ion beam path between the decelerator and the workpiece, wherein the magnet is configured to deflect ions through arcuate paths, wherein unwanted particles are generally filtered from the ion beam, said magnet comprising:
first and second magnetic pole pieces constructed from a ferromagnetic material, wherein the first and second magnetic pole pieces have inwardly facing pole surfaces spaced apart by a magnetic field region through which the ion beam passes;
one or more primary current carrying coils positioned proximate to the first and second magnetic pole pieces, wherein a primary dipole magnetic field in the magnetic field region is generally formed between the inwardly facing pole surfaces of the first and second magnetic pole pieces, wherein charged particles of the ion beam are bent along arcuate paths through the magnetic field region; and
one or more additional current carrying coils for providing electric currents which extend along the arcuate path of the ion beam, therein superimposing a quadrapole field on the dipole field in the magnetic field region between the pole pieces; and
a controller operatively coupled to the primary and additional current carrying coils of the magnet, wherein the controller is configured to control an energizing of the primary and additional current coils, therein forming a magnetic field having both dipole and quadrapole components in the magnetic field region between the pole surfaces.

3. The ion implantation system of claim 2, wherein the one or more additional current carrying coils are attached to the first and second magnetic pole pieces, wherein the one or more additional current carrying coils are positioned between the inwardly facing pole surfaces of the first and second magnetic pole pieces and the magnetic field region.

4. The ion implantation system of claim 2, wherein the inwardly facing pole surfaces are generally planar and spaced on opposite sides of a magnetic field centerplane of the magnet, and wherein two primary current carrying coils abut each other on opposite sides of the magnetic field centerplane, therein defining a generally enclosed magnetic field region.

5. The ion implantation system of claim 2, wherein the first and second magnetic pole pieces are segmented into multiple pole piece segments, and wherein the additional current carrying coils are operatively coupled to a particular magnetic pole piece segment that defines the quadrapole magnetic field in a region bounded by the pole piece segment.

6. The ion implantation system of claim 5, comprising two primary current carrying coils that form saddle-shaped coils extending along sides of the arcuate ion beam path through the magnet, and wherein the saddle-shaped coils bend away from the ion beam path at an entrance and an exit opening through which the ion beam enters the magnet.

7. The ion implantation system of claim 2, comprising two primary current carrying coils that form arcuate-shaped coil portions extending along sides of the arcuate ion beam path through the magnet, and wherein the arcuate-shaped coil portions of the two primary current coils abut each other along a beam centerplane that bisects the magnetic field region.

8. The ion implantation system of claim 2, further comprising a magnetically permeable beam guide that borders the magnetic field region.

9. The ion implantation system of claim 8, wherein the magnetically permeable beam guide bounds an enclosed volume for maintaining a low pressure region through which ions move as they are bent by the magnet.

10. The ion implantation system of claim 2, wherein the first and second magnetic pole pieces are segmented into multiple pole piece segments that widen from a narrow portion on a radially-inner portion of the magnet to a relatively-wider portion on a radially-outer portion of the magnet.

11. The ion implantation system of claim 1, wherein the quadrapole magnetic energy filter apparatus comprises a quadrapole triplet.

12. A method for magnetically filtering an ion beam during an ion implantation into a workpiece, the method comprising:
emitting ions from an ion source and accelerating the ions away from the ion source to form an ion beam;
mass-analyzing the ion beam, wherein ions are selected;
decelerating the ion beam once the ion beam is mass-analyzed; and
magnetically filtering the ion beam downstream of the deceleration, wherein a magnetic field is formed for interce tin the ions in the ion beam exiting the decelerator to selectively filter undesirable ions and fast neutrals, wherein magnetically filtering the ion beam further comprises:
placing first and second arcuately extending pole pieces on either side of an arcuate beam travel path so that inwardly facing pole surfaces are positioned on opposite sides of a magnetic field centerplane;
positioning a primary field generating coil along the arcuately extending pole pieces for creating a primary bipolar magnetic field that extends across the magnetic field region from one of said first and second arcuately extending pole pieces to another of said first and second arcuately extending pole pieces interposing quadrapole field generating coils between inwardly facing surfaces of the first and second arcuate pole pieces and the magnetic field region; and
selectively energizing the both the primary and the quadrapole field generating coils to provide a controlled quadrapole magnetic field in the region between the pole pieces.

13. The method of claim 12, wherein each of the first and second pole pieces are arranged in multiple arcuate pole segments and wherein each pole segment of a pole piece supports a quadrapole field generating coil for setting up a current along a face of the pole segment and further comprising the steps of energizing quadrapole field generating coils attached to opposite pole segments to cause a focusing or defocusing of ions moving through sequentially encountered magnetic field regions between the first and second pole pieces.

14. The method of claim 13, comprising the steps of focusing ions toward a particular plane within a first magnetic field region bounded by a first pair of magnetic pole piece segments and defocusing ions away from the particular plane within in a second magnetic field region bounded by a second pair of magnetic pole pieces that the ions enter subsequent to the first magnetic field region; said steps accomplished through controlled energization of quadrapole field generating coils attached to the first and second pairs of pole pieces.

* * * * *